United States Patent
Otsuka

(10) Patent No.: US 7,313,038 B2
(45) Date of Patent: Dec. 25, 2007

(54) NONVOLATILE MEMORY INCLUDING A VERIFY CIRCUIT

(75) Inventor: Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 11/191,973

(22) Filed: Jul. 29, 2005

(65) Prior Publication Data

US 2006/0227617 A1 Oct. 12, 2006

(30) Foreign Application Priority Data

Apr. 6, 2005 (JP) ............................. 2005-109976

(51) Int. Cl.
*G11C 7/00* (2006.01)
(52) U.S. Cl. ................... 365/201; 365/96; 365/189.05; 365/189.07; 365/225.7
(58) Field of Classification Search .................. 365/94, 365/96, 185.09, 201, 225.7, 100, 105, 185.22, 365/189.05, 189.07; 257/528, 529
See application file for complete search history.

(56) References Cited

U.S. PATENT DOCUMENTS 6,639,863 B2 * 10/2003 Imamura et al. ......... 365/225.7
6,985,395 B2 * 1/2006 Yoshimatsu et al. ........ 365/210
6,992,945 B2 * 1/2006 Otsuka .................... 365/225.7
7,085,181 B2 * 8/2006 Otsuka ....................... 365/200
2005/0041507 A1 2/2005 Otsuka
2006/0197178 A1 * 9/2006 Chung ....................... 257/528

FOREIGN PATENT DOCUMENTS

JP 2001-35185 2/2001
JP 2005-63535 3/2005

OTHER PUBLICATIONS

Fairchild Semiconductor. MM74HC138 (3 to 8 line decoder). Feb. 1999. pp. 1-7.*
U.S. Appl. No. 10/885,718, filed Jul. 8, 2004, Nobuaki Otsuka.

* cited by examiner

*Primary Examiner*—Van Thu Nguyen
*Assistant Examiner*—Alexander Sofocleous
(74) *Attorney, Agent, or Firm*—Oblon, Spivak, McClelland, Maier & Neustadt, P.C.

(57) ABSTRACT

A semiconductor device includes a first nonvolatile memory element group which includes a plurality of first nonvolatile memory elements programmed with data by electrically and irreversibly varying device characteristics, a verify circuit which detects a defective first nonvolatile memory element in the first nonvolatile memory element group, and a second nonvolatile memory element group which includes a plurality of second nonvolatile memory elements programmed with data by electrically and irreversibly varying device characteristics and which stores address data to rescue the defective first nonvolatile memory element.

20 Claims, 6 Drawing Sheets

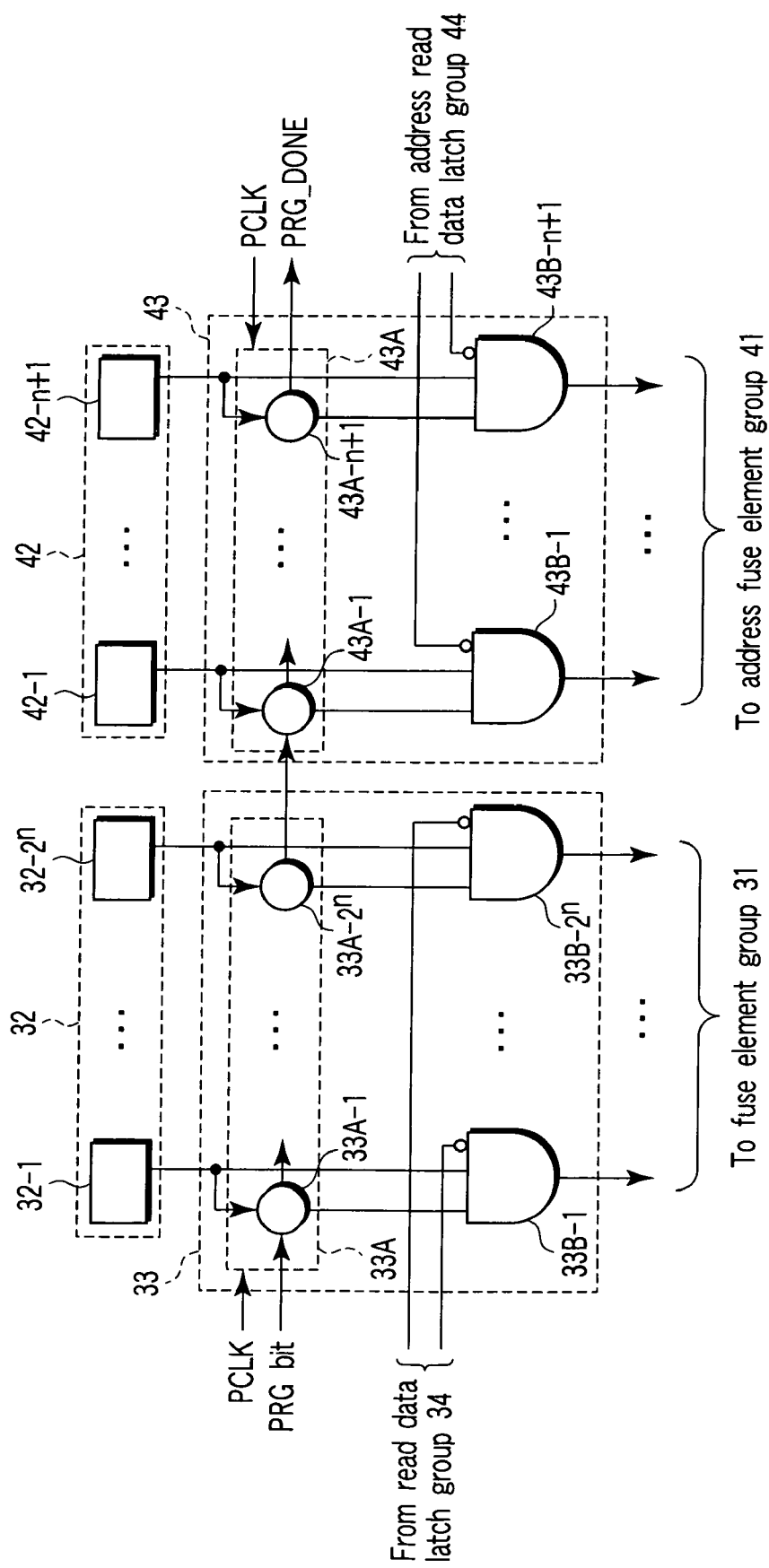
F I G. 6

NONVOLATILE MEMORY INCLUDING A VERIFY CIRCUIT

CROSS-REFERENCE TO RELATED APPLICATIONS

This application is based upon and claims the benefit of priority from prior Japanese Patent Application No. 2005-109976, filed Apr. 6, 2005, the entire contents of which are incorporated herein by reference.

BACKGROUND OF THE INVENTION

1. Field of the Invention

This invention relates to a semiconductor device and a semiconductor integrated circuit and, more particularly, to a semiconductor device and a semiconductor integrated circuit comprising an electrically programmable fuse element.

2. Description of the Related Art

Some methods are known to implement a memory circuit capable of storing data with nonvolatility in a semiconductor device. For example, when a large storage capacity is needed and rewriting data at a number of times is required, a flash memory comprising a memory cell of a stacked gate structure is used. In this case, an especial process different from a standard CMOS process is needed. In a memory circuit such as a memory LSI whose main purpose is to store data with nonvolatility, overhead costs for use of the dedicated process can be reduced by increasing the storage capacity.

In a system LSI or the like, however, overhead costs are increased by using a dedicated process only to store small capacity data such as security data, code data, ID data inherent to a chip, trimming data and the like with nonvolatility. In addition, rewriting data at as many as one hundred thousand times as conducted on a flash memory is not needed though it depends on its purpose. If semi-fixed data is stored with nonvolatility and may be rewritten as occasion requires, rewriting is conducted at a few times. Use of a flash process which requires high costs to be paid for guarantee of rewriting data at as many as one hundred thousand times, for such a purpose, is not advantageous. In this case, it is therefore preferable to use a nonvolatile memory element which can be formed in a standard CMOS process.

A fuse element is widely known as the nonvolatile memory element which can be implemented in a standard CMOS process. In general, a fuse element (o-fuse, optical-fuse) programmed by a laser beam or a fuse element (e-fuse, electrical-fuse) as electrically programmed is used as the fuse element. As the o-fuse, metal or polysilicon wiring is used as the fuse element and data is programmed by applying a laser beam to the fuse element and blowing the fuse element.

On the other hand, as for the e-fuse, for example, an oxide film which is an insulator is used as the fuse element, and data is programmed by breaking the oxide film by application of a high voltage stress and making the oxide film conducting. In other words, data is stored by making the oxide film conducting/nonconducting. As for the other e-fuse, polysilicon wiring having a salicide layer formed on a surface thereof by a salicide process is used as a fuse element, the salicide layer is broken and a resistance value is increased by making current flow by application of high voltage, and data is stored in accordance with variation in the resistance value.

In the e-fuse, an especial apparatus or process is not required for blow. For this reason, the e-fuse can be programmed even after packaging or integration into a system, though the o-fuse needs to be programmed in a state of wafer.

Therefore, the e-fuse becomes used in a wider range, not only for the purpose of storing redundancy data used in a redundancy circuit which rescues a defective memory cell, code data, ID data inherent to the chip, trimming data used to adjust the timing or voltage, and the like, as a substitute to the o-fuse, but also for the purpose of storing encryption data or data stored in an external nonvolatile memory to a chip.

In accordance with such an increasing range of uses, the number of fuse elements (e-fuse) mounted on the LSI is increased. In accordance with this, there is higher possibility that defective fuse elements (e-fuse) which cannot be programmed with normal data are included in the mounted fuse elements (e-fuse), due to defect in process. If even one defective e-fuse exists, a macroblock comprising the e-fuse cannot be used and the LSI chip comprising the macroblock becomes a defective item.

As a related technique of this kind, a technique of replacing defective fuses to conduct redundant rescue is disclosed (see Jpn. Pat. Appln. KOKAI Publication No. 2001-35185).

BRIEF SUMMARY OF THE INVENTION

A semiconductor device according to a first aspect of the present invention comprises: a first nonvolatile memory element group which includes a plurality of first nonvolatile memory elements programmed with data by electrically and irreversibly varying device characteristics; a verify circuit which detects a defective first nonvolatile memory element in the first nonvolatile memory element group; and a second nonvolatile memory element group which includes a plurality of second nonvolatile memory elements programmed with data by electrically and irreversibly varying device characteristics and which stores address data to rescue the defective first nonvolatile memory element.

A semiconductor integrated circuit according to a second aspect of the present invention includes at least one first function block and comprises a second function block which transfers data to the first function block. The second function block is the semiconductor device according to the first aspect of the present invention.

BRIEF DESCRIPTION OF THE SEVERAL VIEWS OF THE DRAWING

FIG. 6 is a circuit diagram showing configurations of write selection circuit 33 and address write selection circuit 43 shown in FIG. 3;

DETAILED DESCRIPTION OF THE INVENTION

Embodiments of the present invention will be explained below with reference to the accompanying drawings.

Elements having like or similar functions and structures are denoted by similar reference numbers and their explanations are repeated if necessary.

First Embodiment

Figure 1:
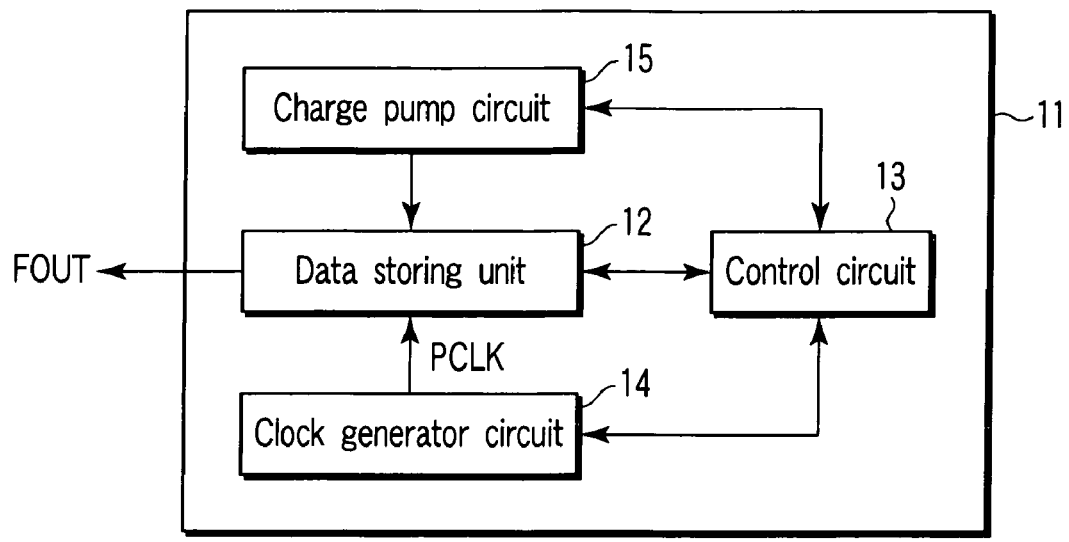
FIG. 1 is a block diagram showing a configuration of fuse box 11 according to a first embodiment of the present invention.

FIG. 1 is a block diagram showing a configuration of fuse box 11 according to a first embodiment of the present invention.

The fuse box 11 comprises a data storing unit 12, a control circuit 13, a clock generator circuit 14, and a charge pump circuit 15. In the fuse box 11, data items of redundancy data used in a redundancy circuit which rescues a defective memory cell, code data, ID data inherent to the chip, security data, trimming data used to adjust the timing or voltage, and the like are stored with nonvolatility. The data items are transferred to other circuit blocks, chips and the like.

The data storing unit 12 stores the data items in a nonvolatile memory element group (fuse element in the present embodiment), and reads and outputs the stored data from the nonvolatile memory element group.

The clock generator circuit 14 generates clock signal PCLK to be used in the data storing unit 12 and supplies the clock signal PCLK to the data storing unit 12. The clock generator circuit 14 also generates a clock signal and the like to be used in the control circuit 13.

The charge pump circuit 15 generates high voltage to be used to blow the fuse element, by using power supply voltage Vcc. Then the charge pump circuit 15 supplies the high voltage to the data storing unit 12.

The control circuit 13 controls operations of the data storing unit 12, clock generator circuit 14 and charge pump circuit 15. Operations of the control circuit 13 will be described later.

Figure 2:
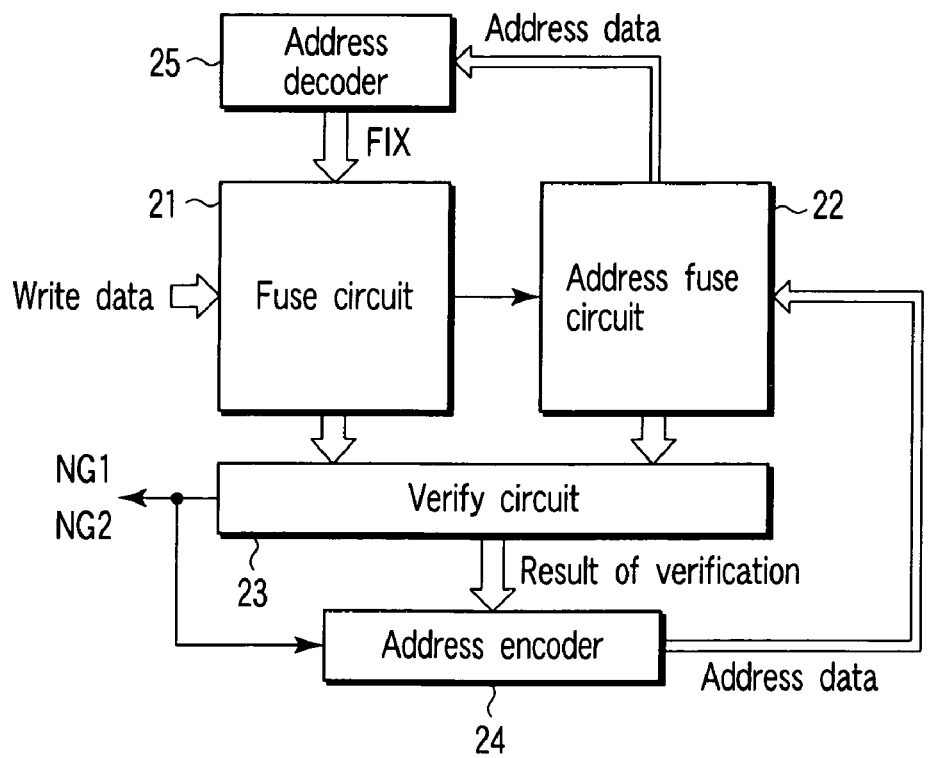
FIG. 2 is a block diagram showing a configuration of data storing unit 12 shown in FIG. 1.

FIG. 2 is a block diagram showing a configuration of the data storing unit 12 shown in FIG. 1. The data storing unit 12 comprises a fuse circuit 21, an address fuse circuit 22, a verify circuit 23, an address encoder 24, and an address decoder 25. In the data storing unit 12 of the present embodiment, the address fuse circuit 22 to rescue the defective fuse circuit 21 is added to the fuse circuit 21 which stores and outputs write data.

For example, write data of $2^n$ bits (n: integer) is input from an external circuit to the fuse circuit 21. The fuse box 11 may comprise the data generator circuit while the data generator circuit may generate the write data (i.e. the write data may be generated in the fuse box 11). The fuse circuit 21 stores the write data and conducts other operations. The address fuse circuit 22 stores address data to rescue a defective fuse element in the fuse circuit 21 and conducts other operations.

The verify circuit 23 verifies whether data has been exactly written in the fuse circuit 21 and the address fuse circuit 22, and outputs a result of verification of each fuse element. In addition, the verify circuit 23 generates error signals NG1, NG2 which represent the number of defective bits.

On the basis of the result of verification of the verify circuit 23, the address encoder 24 generates address data which indicates a position of the fuse element regarded as a write failure. The address encoder 24 also generates a rescue flag bit to activate rescue control which rescues the defective fuse element.

The address decoder 25 decodes the address data stored in the address fuse circuit 22 and specifies the position of the defective fuse element. Then, the address decoder 25 generates fixation data (rescue data) FIX to compulsorily fix data read from the defective fuse element to data representing the write state.

Figure 3:
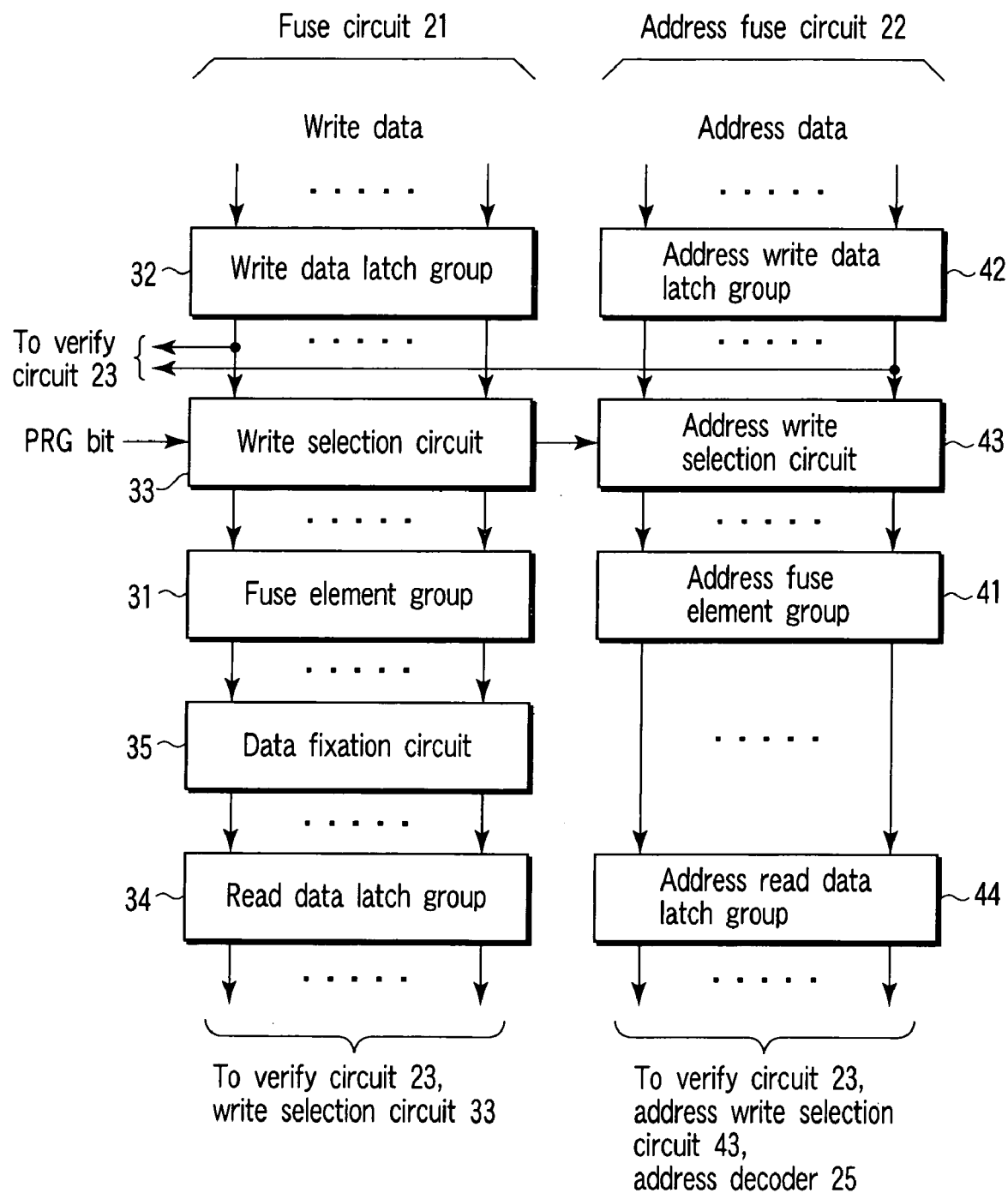
FIG. 3 is a block diagram showing configurations of fuse circuit 21 and address fuse circuit 22 shown in FIG. 2.

FIG. 3 is a block diagram showing configurations of the fuse circuit 21 and the address fuse circuit 22 shown in FIG. 2. The configuration of the fuse circuit 21 is first described. The fuse circuit 21 comprises a fuse element group 31, a write data latch group 32, a write selection circuit 33, a read data latch group 34, and a data fixation circuit 35.

The fuse element group 31 consists of number $2^n$ of electrically programmable fuse elements (e-fuse) 31-1 to 31-$2^n$. Thus, the fuse element group 31 can store $2^n$-bit data. The fuse element group 31 is programmed with write data.

The write data latch group 32 consists of number $2^n$ of write latch circuits 32-1 to 32-$2^n$ corresponding to number $2^n$ of fuse elements (e-fuse) of the fuse element group 31. For example, the write data latch group 32 latches $2^n$-bit write data supplied from an external circuit.

The write selection circuit 33 selects e-fuse to which write data is written in order to serially write data to e-fuse. Then, the write selection circuit 33 blows the selected e-fuse with the high voltage generated by the charge pump circuit 15.

The read data latch group 34 consists of number $2^n$ of read latch circuits 34-1 to 34-$2^n$ corresponding to number $2^n$ of fuse elements (e-fuse) of the fuse element group 31. The read data latch group 34 latches the data read from the fuse element group 31. In addition, the read data latch group 34 latches fixation data supplied from the data fixation circuit 35 to be explained later irrespective of the data read from the fuse element group 31.

The data fixation circuit 35 consists of number $2^n$ of NAND circuits 35-1 to 35-$2^n$ corresponding to number $2^n$ of fuse elements (e-fuse) of the fuse element group 31. The data fixation circuit 35 controls the data latched by the read data latch group 34, on the basis of fixation data FIX1 to FIX$2^n$ supplied from the address decoder 25.

Next, the configuration of the address fuse circuit 22 is described. The address fuse circuit 22 comprises an address fuse element group 41, an address write data latch group 42, an address write selection circuit 43, and an address read data latch group 44.

The address fuse element group 41 consists of number (n+1) of electrically programmable fuse elements (e-fuse) 41-1 to 41-$n$+1. Thus, the address fuse element group 41 can store (n+1)-bit data. The address fuse element group 41 is programmed with the address data supplied from the address encoder 24 and a rescue flag bit to be explained later.

The address write data latch group 42 consists of number (n+1) of write latch circuits 42-1 to 42-$n$+1 corresponding to number (n+1) of fuse elements (e-fuse) of the address fuse element group 41. The address write data latch group 42 latches the address data supplied from the address encoder 24.

The address write selection circuit 43 selects e-fuse to which address data is written in order to serially write data to e-fuse. Then, the address write selection circuit 43 blows the selected e-fuse with the high voltage generated by the charge pump circuit 15.

The address read data latch group 44 consists of number (n+1) of read latch circuits 44-1 to 44-n+1 corresponding to number (n+1) of fuse elements (e-fuse) of the address fuse element group 41. The address read data latch group 44 latches the address data and the rescue flag bit which are read from the address fuse element group 41.

Figure 4:
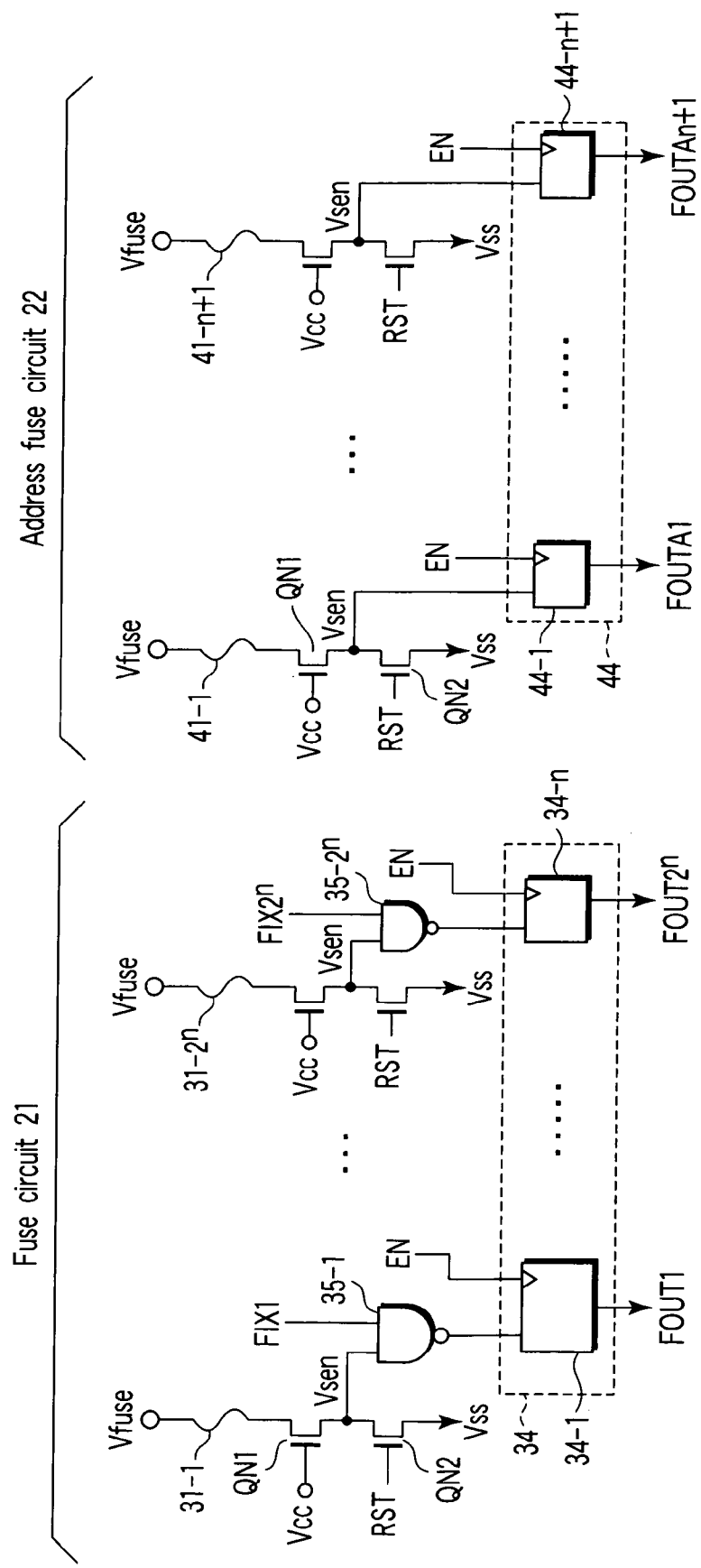
FIG. 4 is a circuit diagram showing configurations of fuse element group 31 and address fuse element group 41 shown in FIG. 3 and their peripheral circuits.

Next, specific configurations of the fuse element group 31, the address fuse element group and a circuit which reads the data stored in these fuse elements, are described. FIG. 4 is a circuit diagram showing configurations of the fuse element group 31 and address fuse element group 41 shown in FIG. 3 and their peripheral circuits.

Voltage Vfuse is supplied to one of terminals of e-fuse 31-1. Two N-type MOS (Metal Oxide Semiconductor) transistors QN1, QN2 are serially connected between the other terminal of the e-fuse 31-1 and ground voltage Vss. Reset signal RST is supplied from the control circuit 13 to the gate of the N-type MOS transistor QN2.

Power supply voltage Vcc is supplied to the gate of the N-type MOS transistor QN1. The N-type MOS transistor QN1 is a buffer transistor to prevent the voltage Vfuse applied when the e-fuse is blown from being directly applied to the source of the N-type MOS transistor QN2 (i.e. to allow voltage obtained by subtracting a threshold voltage of the N-type MOS transistor QN1 from the voltage Vcc to be applied thereto).

A node between the N-type MOS transistor QN1 and the N-type MOS transistor QN2 (where voltage of this node is represented by Vsen) is connected to a first input terminal of the NAND circuit 35-1 included in the data fixation circuit 35. Fixation data FIX1 is supplied from the address decoder 25 to a second input terminal of the NAND circuit 35-1.

Data output from the NAND circuit 35-1 is latched into the read latch circuit 34-1. Enable signal EN to operate the read latch circuit 34-1 is supplied from the control circuit 13 to the read latch circuit 34-1. The read latch circuit 34-1 outputs output data FOUT1. The output data FOUT1 is supplied to the verify circuit 23 and the write selection circuit 33. The other fuse elements (e-fuse) 31-2 to 31-$2^n$ have the same configuration as the fuse element (e-fuse) 31-1.

The configuration of the address fuse element group 41 is the same as that of the fuse element group 31 except for the NAND circuit of the data fixation circuit 35. The read latch circuits 44-1 to 44-n+1 output output data FOUTA1 to FOUTAn+1, respectively. The output data FOUTA1 to FOUTAn+1 are supplied to the verify circuit 23 and the address write selection circuit 43.

Figure 5:
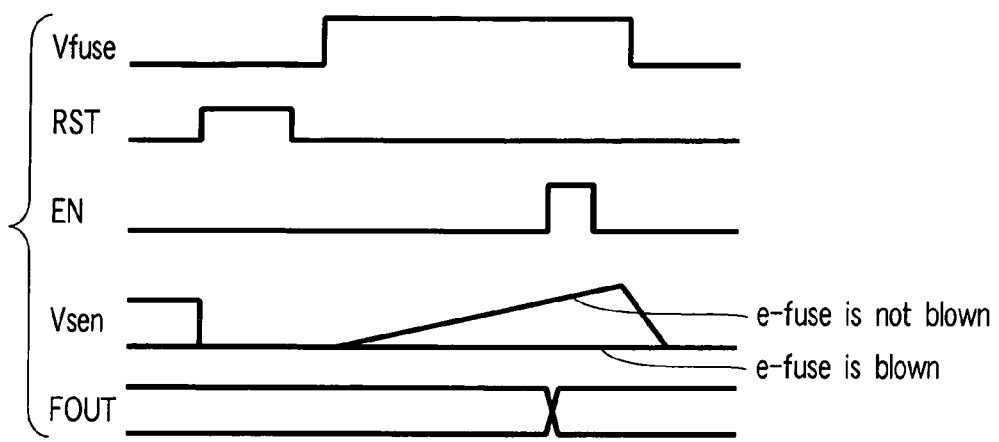
FIG. 5 is a timing chart showing an operation of reading data stored in e-fuse.

FIG. 5 is a timing chart showing an operation of reading data stored in e-fuse. The fixation data FIX is data "1" (not controlling data fixation). In addition, polysilicon wiring is use as the e-fuse.

First, the control circuit 13 supplies high-level reset signal RST to the gate of the N-type MOS transistor QN2. Thus, the N-type MOS transistor QN2 is turned on and voltage Vsen is transited to low level.

Next, the control circuit 13 supplies the voltage Vfuse to the e-fuse. If the e-fuse is blown, the voltage Vsen remains at low level. Then, the control circuit 13 supplies the high-level enable signal EN to the read latch circuit. As a result, the read latch circuit latches data "1".

If the e-fuse is not blown, the voltage Vsen is transited to high level. When the high-level enable signal EN is supplied from the control circuit 13 to the read latch circuit, the read latch circuit latches data "0". Thus, the data stored in the fuse element group 31 can be latched into the read data latch group 34. In the address fuse element group 41, too, the same operation is conducted.

As described above, the polysilicon wiring is used as the e-fuse in the timing chart of FIG. 5. For example, if an oxide film is used as the e-fuse, transition of the voltage Vsen is reversed. In other words, if an oxide film is used as the e-fuse, the voltage Vsen is low level before blow while it is high level after blow.

Next, a specific configuration of a circuit which writes data to the fuse element group 31 and the address fuse element group 41 is described.

Each of the fuse elements (e-fuse) is serially programmed as described above since current of mA order is required to write data to the e-fuse. A shift register to transfer a program bit (PRG bit) is provided such that data can be serially written through only fuse elements (e-fuse) to which data needs to be written. The control of serially writing the data is conducted by the write selection circuit 33 and the address write selection circuit 43. FIG. 6 is a circuit diagram showing configurations of the write selection circuit 33 and the address write selection circuit 43 shown in FIG. 3.

The write selection circuit 33 comprises a shift register 33A and number $2^n$ of AND circuits 33B-1 to 33B-$2^n$ corresponding to fuse elements (e-fuse) of the fuse element group 31. The shift register 33A consists of number $2^n$ of flip-flops 33A-1 to 33A-$2^n$ which are serially connected to correspond to the fuse elements (e-fuse) of the fuse element group 31.

The address write selection circuit 43 comprises a shift register 43A and number (n+1) of AND circuits 43B-1 to 43B-n+1 corresponding to fuse elements (e-fuse) of the address fuse element group 41. The shift register 43A consists of number (n+1) of flip-flops 43A-1 to 43A-n+1 which are serially connected to correspond to the fuse elements (e-fuse) of the address fuse element group 41. The shift register 33A and the shift register 43A are serially connected to each other.

An input terminal of AND circuit 33B-1 is connected to an output terminal of flip-flop 33A-1, an output terminal of write latch circuit 32-1, and an output terminal of read latch circuit 34-1. Thus, the AND circuit 33B-1 is configured to output data "1" when data "1" is latched into the flip-flop 33A-1 and the write latch circuit 32-1 and when data "0" is latched into the read latch circuit 34-1. The other flip-flops have the same configuration as that of the flip-flop 33A-1.

An output signal of the AND circuit 33B-1 is supplied to the fuse element group 31. The output signal of the AND circuit 33B-1 is a signal to select the fuse element (e-fuse) to which the write data is to be written. Specifically, the output signal of the AND circuit 33B-1 is supplied to the gate of the N-type MOS transistor QN2 shown in FIG. 4. When the AND circuit 33B-1 outputs data "1", the N-type MOS transistor QN2 is turned on. Thus, high voltage is applied to both terminals of the e-fuse 31-1 and the e-fuse 31-1 is blown.

The program bit (PRG bit) is supplied from the control circuit 13 to the shift register 33A (specifically, flip-flop 33A-1). The clock signal PCLK is supplied from the clock generator circuit 14 to the shift register 33A and the shift register 43A.

The flip-flops in the shift register 33A and the shift register 43A shift the program bit (PRG bit) from the left side to the right side, on the basis of the clock signal PCLK. Moreover, some of the flip-flops in the shift register 33A and the shift register 43A, i.e. the flip-flops corresponding to the fuse elements (e-fuse) to which the data is to be written and is not still written, shift the program bit (PRG bit) to the right side. The fuse elements (e-fuse) to which the data is to be written are those connected to the write latch circuit which latches data "1". The fuse elements (e-fuse) to which the data is not written are those connected to the read latch circuit which latches data "0".

Therefore, the flip-flops corresponding to the fuse elements (e-fuse) to which the data cannot be written or has been normally written skip the program bit (PRG bit). The write selection circuit 33 and the address write selection circuit 43 thereby select only fuse elements (e-fuse) to which the data needs to be written. Thus, the entire writing process can be ended during the write time for the only number of fuse elements (e-fuse) to which the data needs to be written, of number $(2^n+(n+1))$ of fuse elements (e-fuse).

Figure 7:
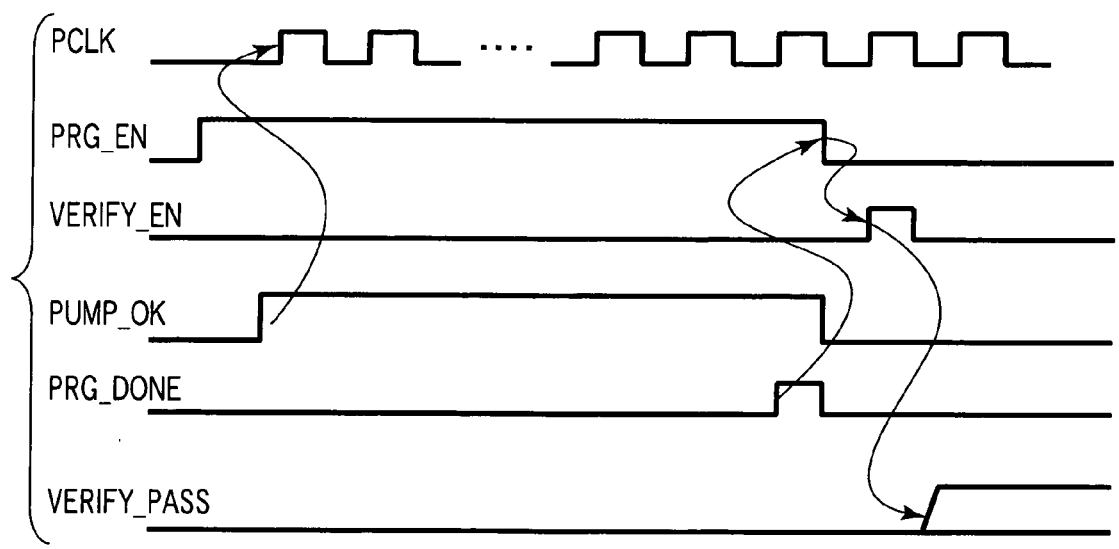
FIG. 7 is a timing chart showing an operation of the fuse box 11.

The operation of the fuse box 11 having the above-explained configuration is described below. FIG. 7 is a timing chart showing an operation of the fuse box 11. First, the operation of writing the data in the fuse element group 31 and the address fuse element group 41 is described. In an initial state, data "0" indicating a state in which the data is not written to the e-fuse is set throughout the address write data latch group 42.

First, $2^n$-bit write data is latched into the write data latch group 32. Next, the control circuit 13 activates program enable signal PRG_EN to execute the program mode in which the fuse element is programmed with data. The program enable signal PRG_EN is supplied to the charge pump circuit 15. The charge pump circuit 15 receives the program enable signal PRG_EN and generates high voltage to blow the e-fuse.

When the high voltage becomes enough level, the charge pump circuit 15 supplies signal PUMP_OK to the control circuit 13. The control circuit 13 receives the signal PUMP_OK, controls the clock generator circuit 14, and supplies the clock signal PCLK to the data storing unit 12. In addition, the control circuit 13 supplies the program bit (PRG bit) to the shift register 33A (specifically, the flip-flop 33A-1).

As described above, the program bit (PRG bit) is shifted to the only flip-flops corresponding to the fuse elements (e-fuse) to which the data are written. At this time, writing data to the fuse elements (e-fuse) is conducted with high voltage supplied by the charge pump circuit 15.

After the program bit (PRG bit) is shifted to the shift register 33A, it is successively shifted to the shift register 43A. In the initial state, however, since the address write data latch group 42 is entirely initialized in a non-write state, the program bit (PRG bit) is not shifted to any flip-flops. Thus, the write time is hardly increased by providing the address fuse element group 41.

When the program bit (PRG bit) is shifted to flip-flop 43A-n+1 of the shift register 43A, the shift register 43A outputs program end signal PRG_DONE. The signal PRG_DONE is supplied to the control circuit 13. The control circuit 13 receives the signal PRG_DONE, deactivates the signal and ends the program mode.

The data stored in the fuse element group 31 and the address fuse element group 41 is read therefrom and latched into the read data latch group 34 and the address read data latch group 44.

Next, the control circuit 13 activates verify enable signal VERIFY_EN. The signal VERIFY_EN is supplied to the verify circuit 23. The verify circuit 23 receives the signal VERIFY_EN and executes verify check.

In other words, the verify circuit 23 verifies whether the data of the write data latch group 32 has been exactly written to the fuse element group 31, on the basis of the data of the read data latch group 34 and the data of the write data latch group 32. Further, the verify circuit 23 verifies whether the data of the address write data latch group 42 has been exactly written to the address fuse element group 41, on the basis of the data of the address read data latch group 44 and the data of the address write data latch group 42.

The verify circuit 23 outputs verify pass signal VERIFY_PASS. As a result of verification, the verify circuit 23 outputs high-level signal VERIFY_PASS if there is no error or outputs low-level signal VERIFY_PASS if there is an error. The signal VERIFY_PASS is supplied to the control circuit 13.

If the control circuit 13 receives the low-level signal VERIFY_PASS, the control circuit 13 executes additional write control. In other words, the control circuit 13 writes again the data of the write data latch group 32 to the fuse element group 31. Then, the control circuit 13 repeats the additional write control at a predetermined number of times until the signal VERIFY_PASS becomes high level. The predetermined number of times is counted by a counter (not shown) provided in the fuse box 11.

When the write operation is ended, the verify circuit 23 generates a result of verification which consists of $2^n$-bit data corresponding to the fuse element group 31. The result of verification is input to the address encoder 24.

If one defective fuse element (e-fuse) exists in the fuse element group 31, the verify circuit 23 generates error signal NG1. If two or more defective fuse elements (e-fuse) exist in the fuse element group 31, the verify circuit 23 generates error signal NG2. The signals NG1 and NG2 are input to each of the control circuit 13 and the address encoder 24.

The result of verification includes (n+1)-bit data corresponding to the address fuse element group 41. In the initial state, however, the fuse elements (e-fuse) and the address write data latch group 42 include data "0" (=non-write). Therefore, the (n+1)-bit data gives no influence to the verify operation unless the write operation to the address fuse element group 41 is executed at the time of rescue control to be described later.

In a case where write failures remain even if the write operation is repeated at the predetermined number of times, if the signal NG2 is activated, the semiconductor device is considered defective since two or more fuse elements (e-fuse) include write failures.

If the signal NG1 is activated, the address encoder 24 generates address data representing the position of the fuse element (e-fuse) which includes write failures, on the basis of the result of verification. The address data consists of n-bit data which represents the address of defective bits, of number $2^n$ of fuse elements (e-fuse) in the fuse element group 31. Moreover, the address encoder 24 generates the rescue flag bit to activate the rescue control of rescuing the defective fuse element group 31 by using the address data.

The address data and the rescue flag bit are input to the address write data latch group 42. The control circuit 13 executes writing data to the e-fuse. Thus, the address data and the rescue flag bit input to the address write data latch group 42 are written to the address fuse element group 41.

Next, the rescue operation using the address data stored in the address fuse element group 41 is explained. First, the address data and the rescue flag bit stored in the address fuse element group 41 are latched into the address read data latch group 44.

The address data and the rescue flag bit read therefrom are input to the address decoder 25. The address decoder 25 determines whether a flag (data "1") stands at the rescue flag bit or not. If the flag (data "1") does not stand at the rescue flag bit, the address decoder 25 does not generate fixation data FIX since the rescue operation does not need to be executed.

If the flag (data "1") stands at the rescue flag bit, the address decoder 25 generates $2^n$-bit fixation data FIX on the basis of the address data. In the fixation data FIX, bits corresponding to the positions of the defective e-fuse are data "0" and the other bits are data "1". The fixation data is input to the data fixation circuit 35.

Next, the data fixation circuit 35 compulsorily fixes the data of bits designated by the fixation data, of the data of the read data latch group 34, to data "1" (write state) irrespective of the data stored in the fuse element group 31. The same conditions as those for normal write can be thereby set for the e-fuse of write failure. Thus, defective fuse elements (e-fuse) of the fuse element group 31 are rescued.

If writing the address data to the address fuse element group 41 is failed, the signal NG1 or NG2 is activated. In this case, the control circuit 13 repeats the write control.

If writing the data to the address fuse element group 41 is normally executed, verification is successful (i.e. the result of verification is normal) by the previously described rescue control in relation to the fuse element (e-fuse) of write failure in the fuse element group 31. Thus, verification is successful (i.e. the result of verification is normal) in relation to all of the fuse elements (e-fuse).

If writing the address data to the address fuse element group 41 is failed, the semiconductor device must be handled as a defective product. In this case, the defective fuse elements (e-fuse) in the fuse element group 31 are not rescued but left besides the defective fuse elements (e-fuse) in the address fuse element group 41. This therefore means that two or more bits wherein verification is failed (i.e. the result of verification is erroneous) exist definitely. As a result, since the signal NG2 is activated, the semiconductor device is considered as a defective product.

Thus, in the verify circuit 23 of the present embodiment, the range of verify check may be increased by (n+1) bits of the address fuse element group 41. In addition, the control of writing data to the address fuse element group 41 may be quite the same as the control of writing data to the fuse element group 31. In other words, especial write control to be caused by providing the address fuse element group 41 does not need to be executed.

If there is originally no failure in the fuse element group 31, the program bit (PRG bit) skips over the address fuse element group 41. Thus, the write control is merely ended in quite the same manner as a case where the address fuse element group 41 is not provided. As for the write control, control of separating the signal NG1 to be generated when only one defective fuse element (e-fuse) exists and the signal NG2 to be generated when two or more defective fuse elements (e-fuse) exist and, in the case where the signal NG1 is generated, setting again the counter of the number of writing times at 0 and starting the e-fuse write flow is only added to the verify circuit 23. The control from the outside may be the same as that in the case where the address fuse element group 41 is not provided.

According to the present embodiment, as described above, even if defective fuse elements (e-fuse) are included in the fuse element group 31 which stores the write data such as code data, redundancy data and the like, the code data and the like can be transferred to the circuit block by automatically rescuing the defective fuse elements in the fuse box 11.

If especial additional control is required to write data to the e-fuse, merit of use of the e-fuse will be lost and the test cost will be increased. In the present embodiment, however, defective fuse elements (e-fuse) can be automatically rescued by using the general write sequence of fuse elements (e-fuse) and normal transfer of fuse data can be executed.

In addition, the result of verification supplied from the verify circuit 23 is converted into n-bit address data by the address encoder 24. The address fuse element group 41 may thereby comprise at least number n of fuse elements (e-fuse), and the number of fuse elements (e-fuse) which should be rescued can be minimized.

Moreover, fuse elements (e-fuse) are used as nonvolatile memory elements in the present embodiment. Therefore, especial devices or steps are not required to blow the nonvolatile memory elements. For this reason, the program can be executed even after packaging or incorporation of the present invention into the system.

Second Embodiment

The present invention according to a second embodiment relates to a semiconductor integrated circuit which comprises the fuse box 11 as described in the first embodiment.

Figure 8:
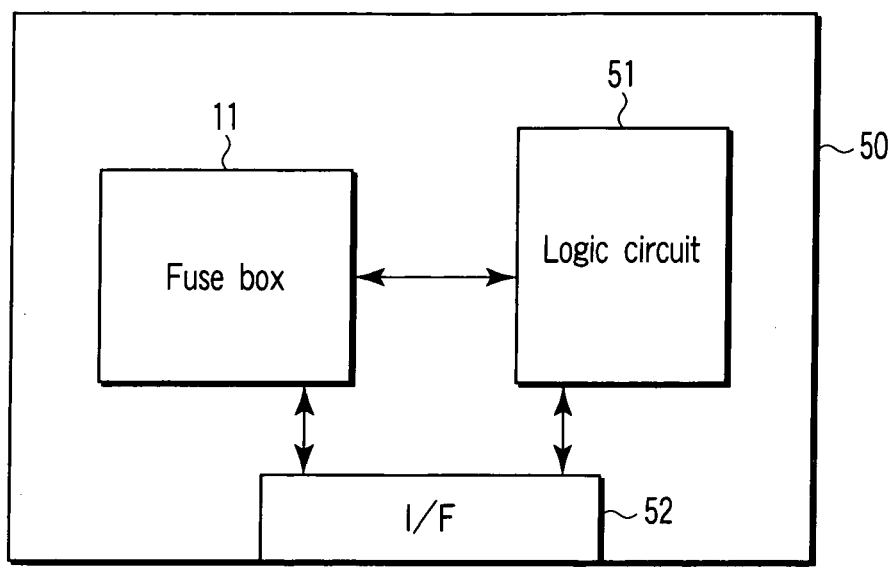
FIG. 8 is a block diagram showing semiconductor integrated circuit 50 according to a second embodiment of the present invention.

FIG. 8 is a block diagram showing a semiconductor integrated circuit 50 according to the second embodiment of the present invention. The semiconductor integrated circuit 50 comprises the fuse box 11, a logic circuit 51, and an interface circuit (I/F) 52.

The logic circuit 51 consists of a MPU (Micro Processing Unit) and the like. The fuse box 11 transfers trimming data which is used to adjust the operation timing of the logic circuit 51, code data which is needed for the operation of the logic circuit 51, and the like to the logic circuit 51. The interface circuit (I/F) 52 controls input/output of data from/to an external device (not shown).

The semiconductor integrated circuit 50 thus constituted does not especial additional control in relation to writing data to the e-fuse. Moreover, since defective fuse elements (e-fuse) are automatically rescued, the fraction defective of the semiconductor integrated circuit 50 can be reduced. Thus, an advantage of mounting the fuse box 11 on the expensive semiconductor integrated circuit 50 is great.

Figure 9:
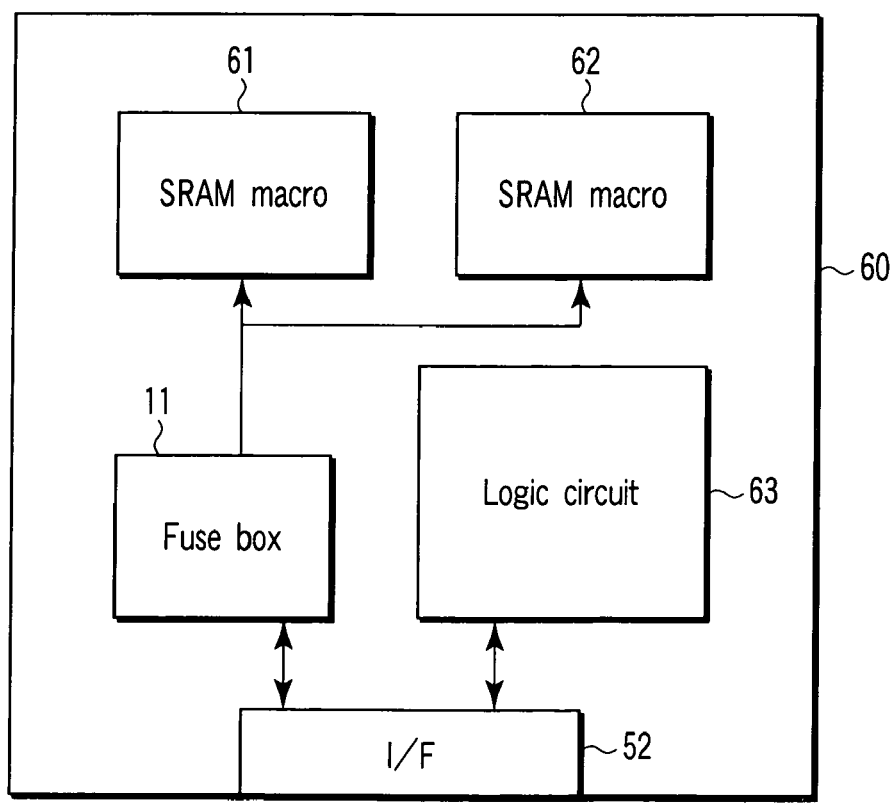
FIG. 9 is a block diagram showing another example of the semiconductor integrated circuit.

FIG. 9 is a block diagram showing another example of the semiconductor integrated circuit. Semiconductor integrated circuit 60 comprises the fuse box 11, two SRAM macros 61, 62, a logic circuit 63, and the interface circuit (I/F) 52.

Each of the SRAM macros is a block which functions as a memory, comprising a memory cell array, a decoder circuit, a sense amplifier circuit, and the like. The fuse box 11 transfers redundancy data and the like used in the redundancy circuit which rescues the defective memory cells to the SRAM macros 61, 62. Even if the semiconductor integrated circuit 60 is thus constituted, the same advantage as that described above can be achieved.

The function block mounted on the semiconductor integrated circuit is not limited to the above-described block, but any other block may be used instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first write latch circuit group configured to latch data, and including a plurality of first write latch circuits corresponding to the size of the data being latched;
a first nonvolatile memory element group including a plurality of first nonvolatile memory elements configured to be programmed with the latched data by electrically and irreversibly varying device characteristics of the first nonvolatile memory element group;
a verify circuit configured to detect a defective first nonvolatile memory element in the first nonvolatile memory element group using the latched data and data read from the first nonvolatile memory element group; and
a second nonvolatile memory element group including a plurality of second nonvolatile memory elements configured to be programmed with address data by electrically and irreversibly varying device characteristics of the second nonvolatile memory element group, wherein the address data indicates a position of the defective first nonvolatile memory element.

2. The semiconductor device according to claim 1, further comprising a first read latch circuit group configured to latch the data read from the first nonvolatile memory element groups, and includes a plurality of first read latch circuits corresponding to the plurality of first nonvolatile memory elements.

3. The semiconductor device according to claim 2, wherein the verify circuit generates a result of verification indicating existence of defects for the plurality of first nonvolatile memory elements.

4. The semiconductor device according to claim 3, further comprising an encoder circuit configured to generate the address data in accordance with the result of verification.

5. The semiconductor device according to claim 4, further comprising a decoder circuit configured to generate rescue data to specify bit of the defective first nonvolatile memory element in accordance with the address data.

6. The semiconductor device according to claim 5, further comprising a data fixation circuit configured to set compulsorily data of a first read latch circuit corresponding to the defective first nonvolatile memory element, to a write state, in accordance with the rescue data.

7. The semiconductor device according to claim 5, wherein the verify circuit generates a first signal representing existence of a defect of one bit and a second signal representing existence of defects of two or more bits, and the encoder circuit generates the address data when the first signal is generated.

8. The semiconductor device according to claim 2, further comprising a selection circuit configured to select first nonvolatile memory elements to which data are written, of the plurality of first nonvolatile memory elements, in accordance with the data of the first write latch circuit group and the data of the first read latch circuit group.

9. The semiconductor device according to claim 8, wherein the selection circuit serially selects the first nonvolatile memory elements to which the data are written.

10. The semiconductor device according to claim 9, wherein the selection circuit includes a shift register, and the shift register has a plurality of bits corresponding to the plurality of first nonvolatile memory elements and shifts bits corresponding to the first nonvolatile memory elements to which the data are written.

11. The semiconductor device according to claim 10, further comprising a second write latch circuit group configured to latch the address data generated by the decoder circuit,
wherein the verify circuit detects a defective second nonvolatile memory element by using the address data of the second write latch circuit group and address data read from the second nonvolatile memory element group.

12. The semiconductor device according to claim 11, further comprising a second read latch circuit group configured to latch the address data read from the second nonvolatile memory element group.

13. The semiconductor device according to claim 12, wherein the selection circuit selects second nonvolatile memory elements to which data are written, of the plurality of second nonvolatile memory elements, in accordance with the address data of the second write latch circuit group and the address data of the second read latch circuit group.

14. The semiconductor device according to claim 13, wherein the selection circuit serially selects the second nonvolatile memory elements to which the data are written.

15. The semiconductor device according to claim 14, wherein the shift register has a plurality of bits corresponding to the plurality of first nonvolatile memory elements and the plurality of second nonvolatile memory elements, and shifts bits corresponding to the first nonvolatile memory elements to which the data are written and the second nonvolatile memory elements to which the data are written.

16. The semiconductor device according to claim 1, wherein the first nonvolatile memory element group has number 2n (n: integer) of first nonvolatile memory elements, and the second nonvolatile memory element group has number n of second nonvolatile memory elements and is programmed with the address data of n bits.

17. The semiconductor device according to claim 16, wherein the second nonvolatile memory element group has number (n+1) of second nonvolatile memory elements and includes a second nonvolatile memory element configured to store a flag bit indicating whether rescue of the first nonvolatile memory element group should be conducted.

18. The semiconductor device according to claim 1, wherein the first nonvolatile memory elements and the second nonvolatile memory elements are electrically programmable fuse elements.

19. A semiconductor integrated circuit including at least one first function block and a second function block configured to transfer data to the first function block, the second function block comprising:
a write latch circuit group configured to latch data, and including a plurality of write latch circuits corresponding to the size of the data being latched;
a first nonvolatile memory element group including a plurality of first nonvolatile memory elements configured to be programmed with the latched data by electrically and irreversibly varying device characteristics of the first nonvolatile memory element group;
a verify circuit configured to detect a defective first nonvolatile memory element in the first nonvolatile memory element group using the latched data and data read from the first nonvolatile memory element group; and
a second nonvolatile memory element group including a plurality of second nonvolatile memory elements configured to be programmed with address data by electrically and irreversibly varying device characteristics of the second nonvolatile memory element group, wherein the address data indicates a position of the defective first nonvolatile memory element.

20. The semiconductor integrated circuit according to claim 19, wherein the second function block further includes a read latch circuit group configured to latch the data read from the first nonvolatile memory element group, and a plurality of read latch circuits corresponding to the plurality of first nonvolatile memory elements.

* * * * *